(12) United States Patent
Hansen et al.

(10) Patent No.: US 10,529,606 B2
(45) Date of Patent: Jan. 7, 2020

(54) DEVICE FOR TREATING SUBSTRATES

(71) Applicant: RENA TECHNOLOGIES GMBH, Guetenbach (DE)

(72) Inventors: Stefan-Heinrich Hansen, Waldkirch (DE); Markus Uihlein, Freiburg (DE); Bernd-Uwe Sander, Freiburg (DE); Stephan Alexis Pediaditakis, Heuweiler (DE)

(73) Assignee: RENA Technologies GmbH, Guetenbach (DE)

( * ) Notice: Subject to any disclaimer, the term of this patent is extended or adjusted under 35 U.S.C. 154(b) by 0 days.

(21) Appl. No.: 15/533,173

(22) PCT Filed: Dec. 3, 2015

(86) PCT No.: PCT/DE2015/100517
§ 371 (c)(1),
(2) Date: Jun. 5, 2017

(87) PCT Pub. No.: WO2016/086924
PCT Pub. Date: Jun. 9, 2016

(65) Prior Publication Data
US 2017/0345697 A1  Nov. 30, 2017

(30) Foreign Application Priority Data

Dec. 5, 2014  (DE) .................. 10 2014 118 039

(51) Int. Cl.
*H01L 21/677*  (2006.01)

(52) U.S. Cl.
CPC .............. *H01L 21/67706* (2013.01)

(58) Field of Classification Search
None
See application file for complete search history.

(56) References Cited

U.S. PATENT DOCUMENTS 5,009,933 A  *  4/1991  Matsuda ............... B05C 3/18
                                                118/407
5,601,655 A     2/1997  Bok et al.

FOREIGN PATENT DOCUMENTS

| JP | 2001341827 A | 12/2001 |
| JP | 2003031546 A | 1/2003 |
| WO | 2005048336 A1 | 5/2005 |

* cited by examiner

*Primary Examiner* — Eric W Golightly
(74) *Attorney, Agent, or Firm* — Laurence A. Greenberg; Werner H. Stemer; Ralph E. Locher

(57) ABSTRACT

A device treats substrates with a liquid, which device has a conveying device by which the substrates can be conveyed in a conveying direction through a container containing a liquid. A weir has an edge over which the substrates can run and which, at least in sections, extends obliquely relative to the conveying direction of the substrates. The weir is used in the device for treating substrates with a liquid. The weir has at least one edge which extends obliquely at least in sections.

16 Claims, 5 Drawing Sheets

DEVICE FOR TREATING SUBSTRATES

BACKGROUND OF THE INVENTION

Field of the Invention

The invention relates to a device for treating substrates with a liquid, and to a weir for use in a device for treating substrates with a liquid.

In many fields, in particular in the semiconductor or more specifically the solar cell industry, treatments of substrates, in particular of wafers, which relate to only one side of the substrate are necessary for various applications. In the case of such unilateral processes, that side of the substrate that is opposite the side to be treated should usually not be affected by the treatment. In the field of wet processes, edge insulation by wet chemistry (unilateral etching of the parasitic emitter that has been applied to the reverse side by diffusion), polishing (chemical smoothing of the textured front or reverse side of the substrate, respectively), galvanic processes such as the electrochemical deposition of a metal coating, or unilateral preconditioning steps prior to other treatments such as hydrophobizing of the substrate edges, are to be mentioned in an exemplary manner herein.

As opposed to batch methods which as a matter of the system relate to both sides of the substrate, unilateral treatments are implementable in various ways in inline methods. In the case of a method for this purpose that is known from EP 1 733 418 B1, full contact of the substrate on the lower side with a treatment liquid is established while configuring of a so-called meniscus. In the case of another known method, unilateral contact between the substrate and the treatment liquid is established by way of structured rollers which transport the treatment liquid up to the lower side of the substrate.

Reference is made to substrates hereabove and hereunder. These also include semiconductor substrates, in particular wafers such as silicon wafers. Solar cell wafers are understood to be wafers that are destined for the production of solar cells.

The aforementioned method for establishing full contact on the lower side between the substrate and the treatment liquid while configuring a meniscus has a number of advantages for the treatment of substrates with a liquid, in particular for unilateral inline processes based on wet chemistry. Apart from a uniform treatment of the lower side of the substrate and from the fully planar thermal contact of the substrate with the surface of the treatment liquid, which usually results in improved process control, by way of the permanent contact of the substrate the use of treatment liquids having a lower concentration is possible than in the case of the treatment liquid being applied by roller to the lower side (same process distance, but longer processing time). Apart from the lower cost of chemicals, this also reduces a potentially aggressive gaseous phase on the upper side of the substrate. Also, in comparison the complexity in terms of apparatus is significantly lower.

However, the principle of full contact of the substrate on the lower side while configuring a meniscus can also have inherent disadvantages. One potential disadvantage lies in that when the meniscus is being torn off, this usually taking place when exiting a container containing the treatment liquid above an exit weir, a liquid lamella, caused by the surface tension of the treatment liquid between the substrate and the surface of the bath, is defined, said liquid lamella tearing when the substrate is transported onward. The main direction of elongation of the lamella herein usually points in the travelling direction of the substrate, which can also be referred to as the transportation direction of said substrate. In the case of such a tear-off, droplets of the treatment liquid are often propelled onto the upper side of the substrate. The intensity of this undesirable effect depends on the surface tension of the treatment liquid, the viscosity of the latter, and on the process management (ratio of filling level of the bath or the container, respectively, to the weir height, and/or the recirculation flow that results therefrom).

In order to address issues that arise from splashes of this type, it may be considered that the properties of the liquid be modified, for example by adding of materials that change the viscosity. However, this is not always possible or desirable, or is associated with other issues. Also, the upper side of the substrate can by protected from the effect of these splashes by one or a plurality of protective layers. However, a significant complexity in terms of the method is often associated therewith, or this procedure is not or only poorly compatible with the other aspects of the process management.

SUMMARY OF THE INVENTION

Against this background, the present invention is based on the object of providing a device which enables splashes of the type described on the upper side of the substrate to be reduced.

This object is achieved by a device having the features of the main device claim.

The invention is furthermore based on the object of providing a weir which enables splashes of the aforementioned type to be reduced.

This object is achieved by a weir having the features of the main weir claim.

The invention is furthermore based on the object of providing a method by means of which the formation of splashes can be reduced when a liquid lamella is being detached from a substrate edge.

This object is achieved by a method having the features of the alternative independent claim.

Advantageous refinements are the respective subject matter of dependent claims.

The device according to the invention for treating substrates with a liquid has a transportation device, by means of which the substrates are transportable in a transportation direction through a container that contains the liquid, and a weir having an edge that is navigable by the substrates and at least in portions runs obliquely to the transportation direction of the substrates.

The invention is based on the concept that the aforedescribed splashes arise above all when the edge of the weir that is navigable by the substrates runs orthogonally to the transportation direction of the substrates. This is because the mechanical force that acts on the liquid lamella that is configured between the liquid and the substrate rear edge when the substrates are being transported onward is at maximum in this case. Once the stress limit of the liquid lamella is exceeded, the latter at a geometrically unspecified point begins to rupture, and splashes can be propelled onto the upper side of the substrate or onto the upper side of subsequent substrates.

However, if that edge of the weir that is navigable by the substrates is at least in portions configured so as to be oblique to the transportation direction of the substrates, the load that in the course of the substrate being moved onward acts on the liquid lamella is at maximum at that corner of the substrate rear edge that first navigates the edge, such a retraction of the liquid lamella commences at this corner. As a consequence, a retraction front of the liquid lamella is configured. If the substrate is transported onward in the transportation direction, this retraction front runs to an opposite corner of the substrate rear edge. The influence of force on the liquid lamella can be reduced in this way. The liquid lamella is pretensioned to a lesser extent. "Soft" tearing off is initiated by the retraction front that runs from one corner of the substrate rear edge to the other corner, said retraction front simultaneously representing a tear-off front. As a consequence, splashes onto that upper side of the substrate or of a subsequent substrate that is not to be treated can be avoided or at least reduced.

The aforedescribed effect can also be achieved by way of an oblique alignment of the substrates in relation to the navigable edge of the weir, or by placing the substrates onto the transportation device in a rotated manner. However, in practice this is disadvantageous for a plurality of reasons:

On the one hand, placing the substrates in such a rotated manner is not possible with all commonly used handling systems. Rather, commonly used handling systems are adapted for the substrates to be placed onto the transportation device by way of one substrate side being parallel with the transportation direction. Those systems that in principle permit rotated placing would have to be adapted, in particular instructed, to this end in a complex manner.

On the other hand, substrates that have been placed in such a rotated manner can be centered on a transportation track only with difficulty and by way of complex means. In the case of the substrates being rotated manually on the transportation device, reproducible rotated positioning without aids is achievable only with great difficulty. Moreover, practice has demonstrated that rotated placing of the substrates can be associated with increased breakages and consequently higher costs.

Not least, by placing the substrates in a rotated manner, the effective length and width of the substrates and with this the required passage clearance and passage length are increased, this making the device more expensive at the same throughput.

By virtue of these disadvantages, the substrates by means of the transportation device are advantageously transported in such a manner that two edges of the substrate run so as to be parallel with the transportation direction, wherein the weir however has the edge designed according to the invention, which at least in portions runs obliquely to the transportation direction of the substrates.

In one advantageous design embodiment, the edge extends across at least two transportation tracks and therebetween has an inconsistent edge profile. A transportation track in the context of the present invention is to be understood to be a motion track of the substrates on which the substrates by means of the transportation device are transportable through the container that contains the liquid. In as far as mention is made in this application of transportation of the substrates "through" the container that contains the liquid, the term "through" is to be understood in a very wide context. It thus depends on the specific design embodiment of the transportation device whether the substrates are transported literally through the container or rather across the top of the container. For example, the substrates by means of transportation rollers are first transported across a container wall, before being transported in the container at a level that is below an upper edge of the container wall through the container, the lower sides of said substrates thereby being brought into contact with the liquid. In this exemplary case, the substrates are transported literally through the container. In particular, the surface of the liquid in this container can be lower than the upper edge of the container wall. In another variant of design, the surface of the liquid in the container can be higher than the upper edge of the container wall. As a consequence, liquid runs across the container wall and is collected in an overflow container, for example, and returned to the container. In this case, the substrates when being transported do not have to be lifted across the container wall but can be transported across the container wall and the container having the liquid therein at the same height as outside the container, specifically in such a manner that the lower sides of the substrates are brought into contact with the liquid as said lower sides are being transported across the container. In the case of this variant of design, many observers would possibly tend not to refer to the transportation of the substrates "through" the container, but instead refer to transportation of the substrates across the container. However, in the context of the present application and of the present invention, this variant of design and embodiments with an equivalent effect are also comprised by the term "through", such that transportation of the substrates through the container is present therein.

The at least two transportation tracks are preferably aligned so as to be mutually parallel such that a plurality of rows of substrates are simultaneously transportable beside one another through the container that contains the liquid.

A width of the transportation track is presently to be understood to be a maximum width of the substrates that are transported in this transportation track. This width of the transported substrates extends perpendicularly to the transportation direction. In the context of the present invention, a region is located between two transportation tracks when said region is not covered by at least one transportation track. In practice, the transportation track can be chosen to be wider in order to be able to take into account variations in the substrate dimensions or inaccuracies in positioning the substrates on the transportation device.

An inconsistent edge profile in the context of the present invention is understood to be an edge profile which has at least one step in the direction of the transportation direction or in the opposite direction.

The inconsistent edge profile is advantageously configured in such a manner that said inconsistent edge profile has a step between two of the at least two transportation tracks. In the case of the edge extending across more than two transportation tracks, it is advantageous when the edge profile has a step between each of the transportation tracks. An edge profile of this type advantageously configures a sawtooth profile.

Such an inconsistent edge profile is readily producible, for example by joining a plurality of weir or edge elements, respectively, that run in a straight line and are therefore producible with little complexity.

According to one preferred refinement, the edge extends across at least two transportation tracks and therebetween has a consistent edge profile.

In the context of the present invention, an edge profile is consistent when the latter in the transportation direction and in the opposite direction does not have any step. The consistent edge profile advantageously runs in the form of a triangular profile across the transportation tracks such that a kink is in each case disposed between the transportation tracks. In this way, as compared to a weir having an inconsistent edge profile between the transportation tracks, a reduced investment in material and thus a less complex production can be achieved.

In one advantageous embodiment, the edge has an edge profile that in the mathematical sense is differentiable at each point. The edge profile can advantageously be configured so as to be sinusoidal. It is also conceivable for the edge profile to be configured as an arbitrary curve or according to a polynomial function. It has been demonstrated in practice that a particularly gentle tear-off of the liquid lamella from the substrates and consequently an even greater reduction of splashes onto the substrate upper side can be achieved by way of an edge profile of this type.

In order for a particularly large angle of inclination of that edge that is navigable by the substrates to be obtained within one transportation track, it is advantageous when the edge within this transportation track has an inconsistent edge profile. The stress on the liquid lamella on the substrate rear edge can be further reduced by way of the angle of inclination that is maximized in this manner within the transportation track, and on account thereof an even softer tear-off can be achieved, and ultimately the quantity of the liquid that is unintentionally splashed onto the substrate upper side can be further reduced.

In one further design embodiment, the edge at least in portions has a rounded, preferably a sinusoidal, edge profile. The tear-off behavior of the liquid film can advantageously be influenced by way of a respective adaptation of the rounded profile, while considering further process parameters such as, for example, the viscosity of the fluid, or the like.

In terms of a simplified assembly of the weir in the device it can be advantageous when the edge extends across more than two transportation tracks, preferably across at least three transportation tracks, and particularly preferably across all transportation tracks. Additional assembly complexity for the assembly of individual weirs or edge elements per transportation track can be avoided in this manner.

Transportation of the substrates that is particularly favorable in terms of complexity and gentle on the material can be achieved when the device has transportation rollers that in the transportation direction are disposed ahead of and behind the weir and by means of which the substrates are transportable through the container that contains the liquid.

In one advantageous design embodiment, the edge in the transportation direction extends across at least 50%, of an available spacing of the transportation roller that when viewed in the transportation direction is disposed as the last one ahead of the weir. It has been demonstrated in practice that an already sufficiently large angle of inclination of the edges and consequently an effective avoidance of splashes onto the substrate upper side can be achieved in this manner. In order for the angle of inclination of the edge in relation to the transportation direction between two transportation rollers to be further increased, it is advantageous for the edge in the transportation direction to extend across at least 75% and particularly preferably across at least 95% of the available spacing described.

In the case of individual applications it may be necessary for the transportation rollers to be disposed ahead of and behind the weir at such a minor spacing that a sufficiently oblique edge profile is no longer possible in the case of the weir being disposed between the transportation rollers. In such cases, it is advantageous for the rotation axle of at least one of the transportation rollers to penetrate the weir. It can be achieved in such a manner that the edge of the weir, despite the minor spacing of the transportation rollers, can be embodied in a sufficiently oblique manner such that splashes onto the substrate upper side can be avoided.

The device according to the invention can be advantageously used for treating the lower sides of substrates, preferably solar cell wafers, by wet chemistry by way of a liquid. The substrate lower sides herein are preferably brought into contact with the liquid that is disposed in a container in such a manner that a meniscus is configured between the liquid surface in the container and the substrates.

A weir for use in a device for treating substrates with a liquid is further a subject matter of the invention. The weir according to the invention has an edge that runs obliquely at least in portions.

Protruding portions of the edge that protrude so as to be substantially perpendicular to the main direction of extent of the weir are presently referred to as protrusions of the weir, or as protrusions of the edge of the weir, respectively. In an analogous manner, the weir or edge portions that are recessed in the opposite direction are referred to presently as recesses of the weir, or of the edge of the weir, respectively. In one advantageous refinement, the edge has at least one protrusion or at least one recess, preferably a protrusion.

In one preferred embodiment, the edge at least in portions has a sawtooth profile. The protrusions and/or recesses of the edge that configure the sawtooth profile herein run so as to be substantially perpendicular to the main direction of extent of the weir.

Depending on the specific process parameters at which the weir is to be employed in the device, it can moreover be advantageous for the edge at least in portions to have a triangular profile and/or an undulated profile.

With a view to a uniform outflow of the liquid from the edge of the weir it is advantageous for the edge to have an in particular undulated vertical profile. A vertical profile is presently understood to be a profile of the edge of the weir that extends perpendicularly to the edge profile that is oblique at least in portions.

The weir is preferably made so as to be integral, in particular by way of subtraction of material from an integral primary body, for example by milling. It has been demonstrated in practice that improved dimensional accuracy (linearity) of the weir edges can be guaranteed in this way. Moreover, the weir can be produced by fewer operational steps. This holds true in particular in comparison to an alternative production method for the weir, in which the shape of the edge is implemented by folding in a plastics plate and subsequent fixing of the latter by means of welding. The aforementioned advantages also result in comparison to a production of the weir by way of individual plates that are retroactively connected. It has moreover been demonstrated in practice that in the case of the described production of the weir by means of material subtraction, in particular by means of milling, suitable fastening elements on the lower side of the weir can be formed at low investment. These fastening means allow reliable and simple fastening of the weir to the associated device.

In one further embodiment, the weir has at least one opening for receiving an axle. In as far as the device in which the weir is to be used disposes of transportation rollers for transporting the substrates, the axle of at least one of these transportation rollers can be received in the at least one opening of the weir. The weir advantageously has a sealing element that is disposed in the at least one opening.

The invention is moreover directed toward the use of a weir according to the invention in a device according to the invention.

The method according to the invention for detaching a liquid lamella from a substrate edge provides that a tear-off front is configured at at least one point of the liquid. This tear-off front is guided along the substrate edge and a width of the liquid lamella (20) is reduced in this way. The width of the liquid lamella herein is to be understood as the extent of the latter substantially parallel with the substrate edge. As has been described above, the influence of force on the liquid lamella can be reduced by reducing the width of the liquid lamella before the latter is torn off the substrate edge, and the risk of the formation of splashes can be reduced in this way.

The width of the liquid lamella prior to the liquid lamella being torn off the substrate edge, as compared to the original width thereof, is preferably reduced by at least 50%, preferably by at least 80%, and particularly preferably by at least 97%. The risk of the formation of splashes can be increasingly reduced and at best completely avoided in this way.

In one preferred variant, the tear-off front is configured at a corner of the substrate edge. This has proven successful in practice.

The tear-off front is advantageously guided up to a corner of the substrate edge. This enables a simple and reliable method management.

The invention will be furthermore explained in more detail by means of figures. In as far as expedient, elements with equivalent functions are provided with the same reference signs. The invention is not limited to the exemplary embodiments that are illustrated in the figures, this also applying to functional features. The description up to this point as well the description of the figures hereunder include numerous features which in the dependent subclaims are to some extent reflected so as to combined with one another. However, a person skilled in the art will consider these features as well as all other features that are disclosed above and hereunder in the description of the figures individually and combine these features to form further purposeful combinations. In particular, these features are in each case combinable individually and in any suitable arbitrary combination with the device and the weir of the respective independent claim.

DESCRIPTION OF THE INVENTION

Figure 1:
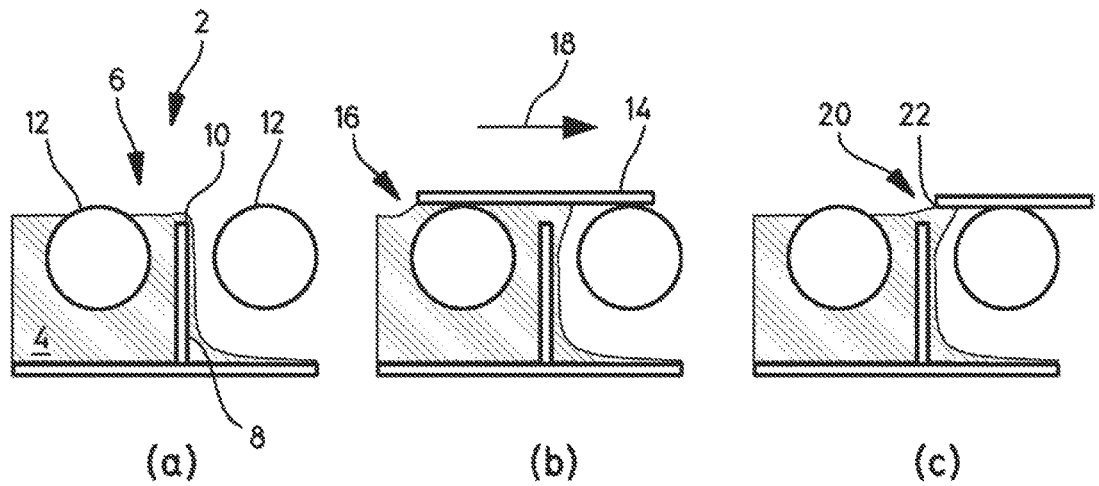
FIG. 1 shows schematic illustrations of a fragmented lateral view of a device according to the prior art in a first (a), a second (b), and a third (c) state.

FIG. 1 shows a device 2 for treating substrates with a liquid 4, according to the prior art, in a first (a), a second (b), and a third (c) state. The device 2 is illustrated in a sectional illustration and, for reasons of clarity of the drawing, only in a fragmented manner, that is to say with the omission of further elements of the device 2. The device 2 has a container 6 that contains the liquid 4 and is unilaterally delimited by means of a weir 8. The weir 8 is configured for preventing, or limiting, respectively, a discharge of the liquid 4 from the container 6. Moreover, the weir 8 has a straight edge 10 that is navigable by substrates 14. Transportation rollers 12 by means of which substrates are transportable across the liquid 4, or across the edge 10 of the weir 8, respectively, are disposed on either side of the weir 8.

Such a state of transportation is schematically illustrated in FIG. 1(b). The latter shows how the substrate 14, while configuring a lower-side liquid film 16, by means of the transportation rollers 12 is transported across the weir 8 and the edge 10 of the latter along a transportation direction 18. As can be seen in FIG. 1(c), caused by the surface tension of the liquid 4, a liquid lamella 20 is configured on the read edge 22 of the substrate 14 when the substrate 14 is being transported onward. Said liquid lamella 20 is not immediately torn off but is elongated when the straight edge 10 is navigated.

Figure 2:
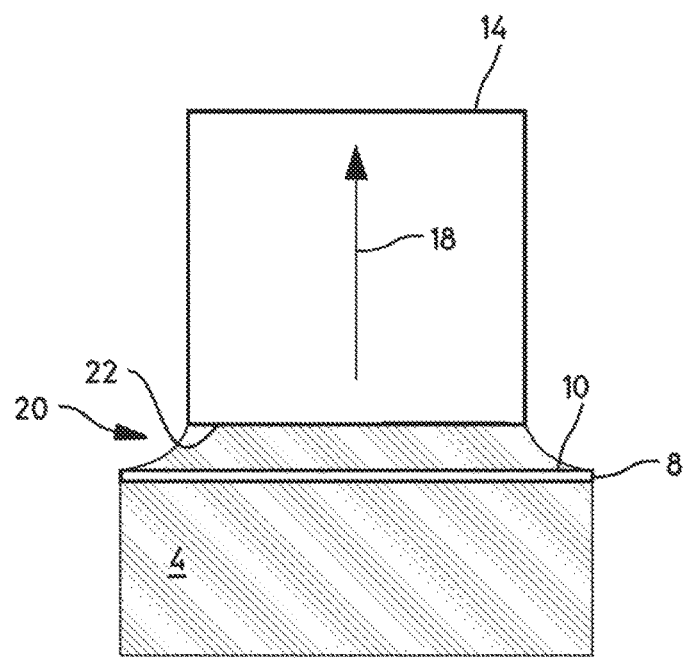
FIG. 2 shows an in-principle illustration for highlighting the configuration of a liquid lamella between a substrate rear edge and a weir having a linear edge according to the prior art.

FIG. 2 shows an in-principle illustration for highlighting the configuration of this liquid lamella 20 between the substrate rear edge 22 and the weir 8, or the straight edge 10, respectively. The view of FIG. 2 herein corresponds to a plan view of the state illustrated in FIG. 1 (c), wherein for reasons of clarity a few elements of the device 24 are not illustrated. When the substrate 14 is being transported onward along the transportation direction 18, further elongation of the liquid lamella 20 takes place until the stress limit of the latter is exceeded, and consequently tearing-off of the liquid lamella 20 from the substrate rear edge 22 arises. A substantially homogeneous elongation of the liquid lamella 20 along the transportation direction 18 is established by way of the straight profile of the edge 10 of the weir 8 in relation to the transportation direction 18. In simple words, there exists no point along the liquid lamella 20 that has a pronounced superelevation in terms of tension. The tear-off of the liquid lamella 20 thus takes place so as to proceed from a geometrically not unequivocally established point. In the case of a tear-off of the liquid lamella 20 that is undefined in such a manner, a formation of splashes in which liquid 4 is unintentionally propelled onto the upper side of the substrate 14 or of subsequent substrates in the process often arises.

Figure 3:
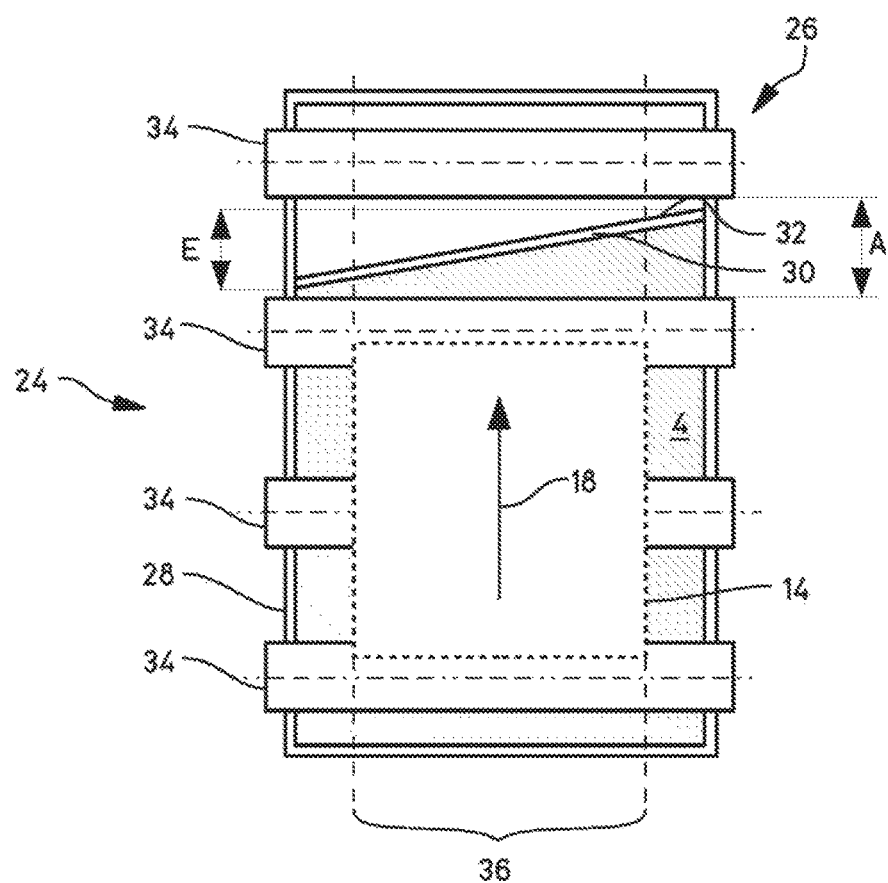
FIG. 3 shows a first exemplary embodiment of a device and of a weir having an edge that runs obliquely at least in portions, in a schematic illustration.

FIG. 3 shows a schematic illustration of a device 24 for treating substrates 14 with a liquid 4. The device 24 has a transportation device 26 by means of which the substrates 14 are transportable through a container 28 that contains the liquid 4. The device 24 moreover has a weir 30 having an edge 32 that is navigable by the substrates 14, said edge 32 at least in portions running obliquely to the transportation direction 18 of the substrates 14.

The transportation device 26 has transportation rollers 34 that in the transportation direction 18 are disposed ahead of and behind the weir 30 and by means of which the substrates, or the substrate 14, respectively, are/is transportable through the container 28 that contains the liquid 4.

In the present exemplary embodiment, the maximum extent E of the edge 32 in the transportation direction 18 is at least 95 percent of the spacing A of the transportation rollers 34 which in the transportation direction 18 are disposed directly ahead of and behind the weir 30.

The substrate in FIG. 3 is illustrated with dashed lines, since said substrate is not a component part of the device 24. By way of the bearing of the individual substrate 14 on the transportation rollers 34 as is illustrated in the present case, a single transportation track 36 is configured along the transportation direction 18, the substrate 14 moving along said transportation track 36 through the container 28 that contains the liquid 4. The illustration of FIG. 3 is limited to merely one transportation track 36, wherein further transportation tracks 36 can be configured by having a plurality of substrates 14 that are smaller and/or narrower bearing thereon, for example, and/or by using wider transportation rollers. The device 24 can fundamentally also have a plurality of transportation devices 26 or transportation rollers 34, respectively, that are disposed beside one another, such that one transportation track 36 can be configured along each one of the rows of transportation rollers that lie beside one another.

Figure 4:
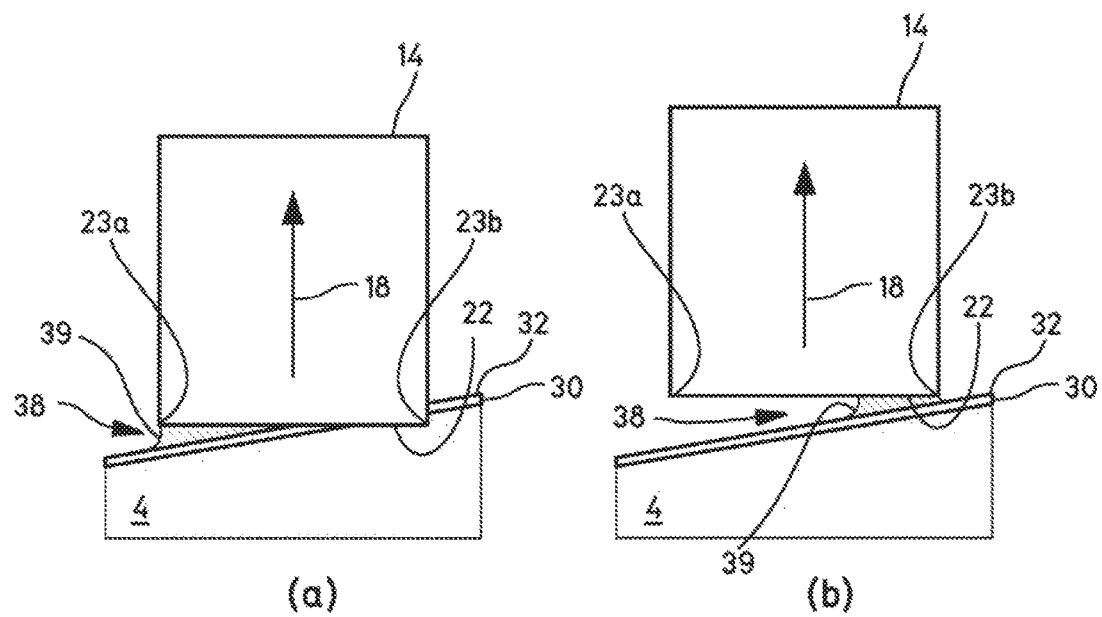
FIG. 4 shows an in-principle illustration for highlighting the configuration of a liquid film in the case of an edge that runs obliquely at least in portions, in a first (a) and a second (b) state, and an exemplary embodiment of the method according to the invention.

FIG. 4 shows an in-principle illustration for highlighting the tear-off of a liquid lamella 38 from the substrate rear edge 22 when navigating the edge 32 of the weir 30 that runs obliquely to the transportation direction 18, in a first (a) and a second (b) state. FIG. 4 in this way simultaneously illustrates an exemplary embodiment of the method according to the invention. As has already been highlighted in the context of the in-principle illustration in FIG. 2, the liquid lamella 20 when navigating the edge 32 is first elongated along the transportation direction 18 and mechanically stressed. Since the edge 32 of the weir 30 runs obliquely to the transportation direction 18, the liquid lamella 38 is initially imparted the maximum mechanical stress at a lower left corner 23a of the substrate 14, or at the corner 23a of the substrate edge 22, respectively. As is illustrated by FIG. 2(b), a tear-off front 39 is configured at this point, and emanating from this point, a retraction of the liquid lamella 38 in the direction of the right lower corner 23b of the substrate 14 commences. The tear-off front 39 is guided along the substrate edge 22, and a width of the liquid lamella 38 is reduced in this way. As a result of the oblique profile of the edge 32, the tear-off front 39 is guided up to the corner 23b of the substrate edge 22, and a targeted tear-off of the liquid lamella 38 is achieved at said corner 23b, in which tear-off the formation of splashes and the unintentional application of liquid 4 onto the upper side of the substrate 14 can be avoided.

Figure 5:
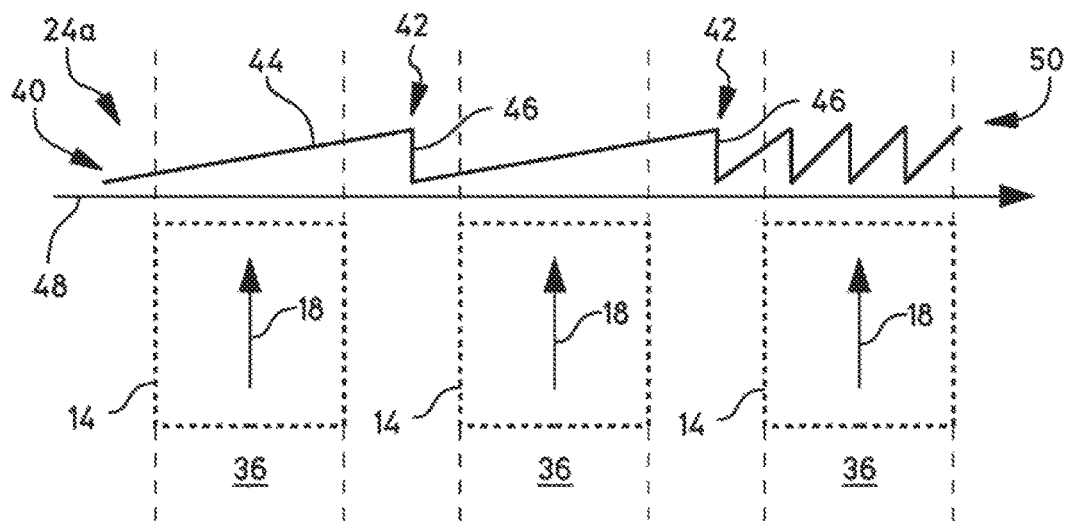
FIG. 5 shows a schematic illustration of a refinement of the device according to FIG. 3.

FIG. 5 shows a further device 24a in which three transportation tracks 36 for the substrates 14 are configured, said three transportation tracks 36 running so as to be mutually parallel and along the transportation direction 18. The device 24a otherwise differs from the device 24 substantially in terms of the design of the weir and of the edge of the latter, such that the further elements of the device 24a are not illustrated in FIG. 5.

The weir 40 that is used in the exemplary embodiment of FIG. 5 has an edge 44 which extends across at least two of the transportation tracks 36 and therebetween has an inconsistent edge profile 42. The edge profile 42 along the transportation direction 18 has a plurality of protrusions 46. Alternatively, the latter can fundamentally also be embodied as recesses. The protrusions 46 extend substantially in a direction that runs perpendicularly to a main direction of extent 48 of the weir. Accordingly, the edge 44 has a sawtooth profile 50. In order for the angle of inclination within a transportation track to be further maximized, the edge 44 within the right transportation track 36 has an inconsistent edge profile having a plurality of protrusions 46.

Figure 6:
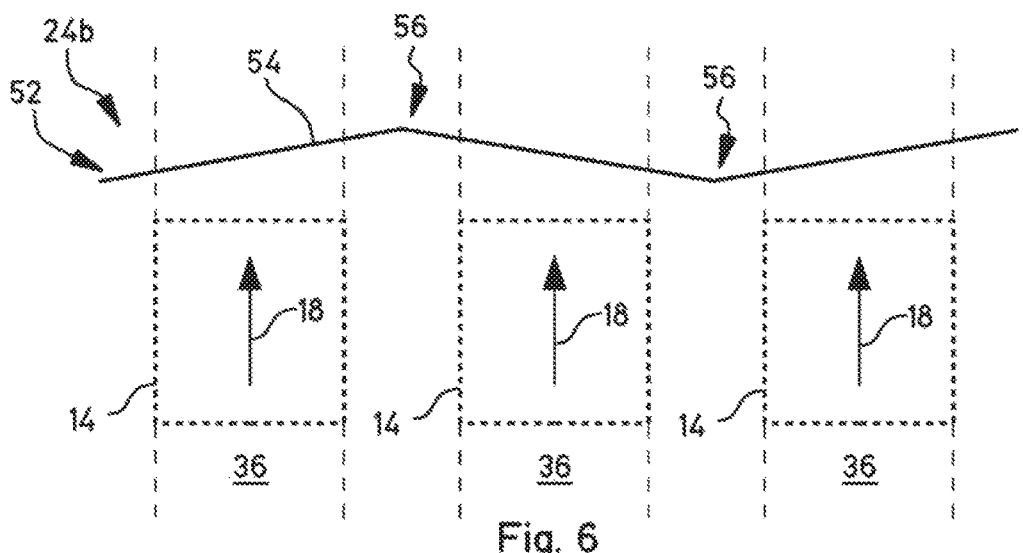
FIG. 6 shows a schematic illustration of a further embodiment of the device according to FIG. 3.

FIG. 6 shows a further device 24b having a weir 52 which has an edge 54. The edge 54 extends across three transportation tracks 36 and therebetween has a consistent edge profile 56. As for the illustration of further elements of the device 24b in terms of the drawing, the explanations pertaining to FIG. 5 apply in an analogous manner.

Figure 7:
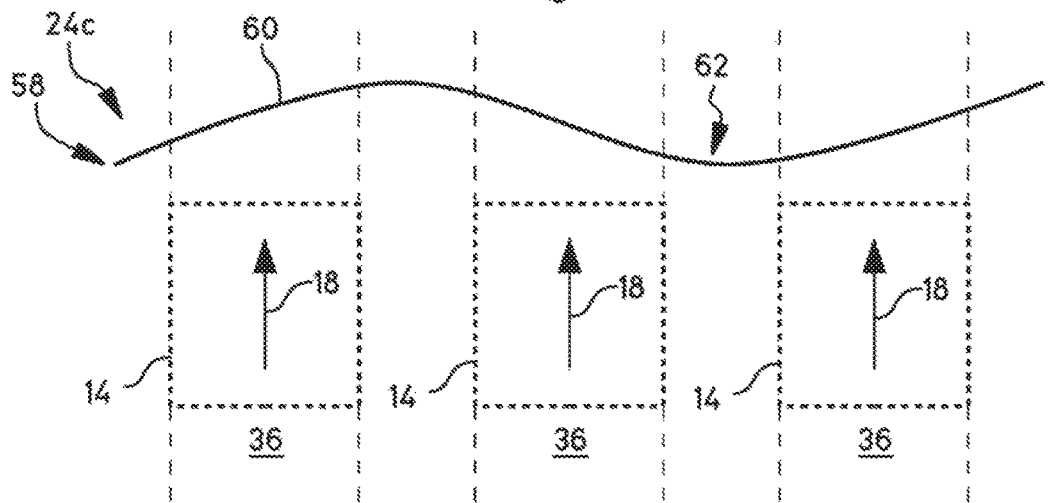
FIG. 7 shows a schematic illustration of a further design embodiment of the device according to FIG. 3.

A further device 24c is illustrated in FIG. 7. Said device 24c has a weir 58 having an edge 60 which in turn extends across three transportation tracks 36. The edge 60 presently has an edge profile 62 that is differentiatable at each point. The edge profile 62 has neither steps nor kinks. The edge 60 is rounded and presently has a sinusoidal edge profile. As for the illustration of further elements of the device 24c in terms of the drawing, the explanations pertaining to FIG. 5 apply in an analogous manner.

Depending on the case of application, it is also possible for one and the same edge to have a portion-by-portion combination of the edge profiles 42, 56 and 62 that are included in the exemplary embodiments according to FIGS. 5, 6, and 7. In other words, one and the same weir can have an edge having an edge profile that portion-by-portion is consistent, inconsistent, and/or differentiatable.

Figure 8:
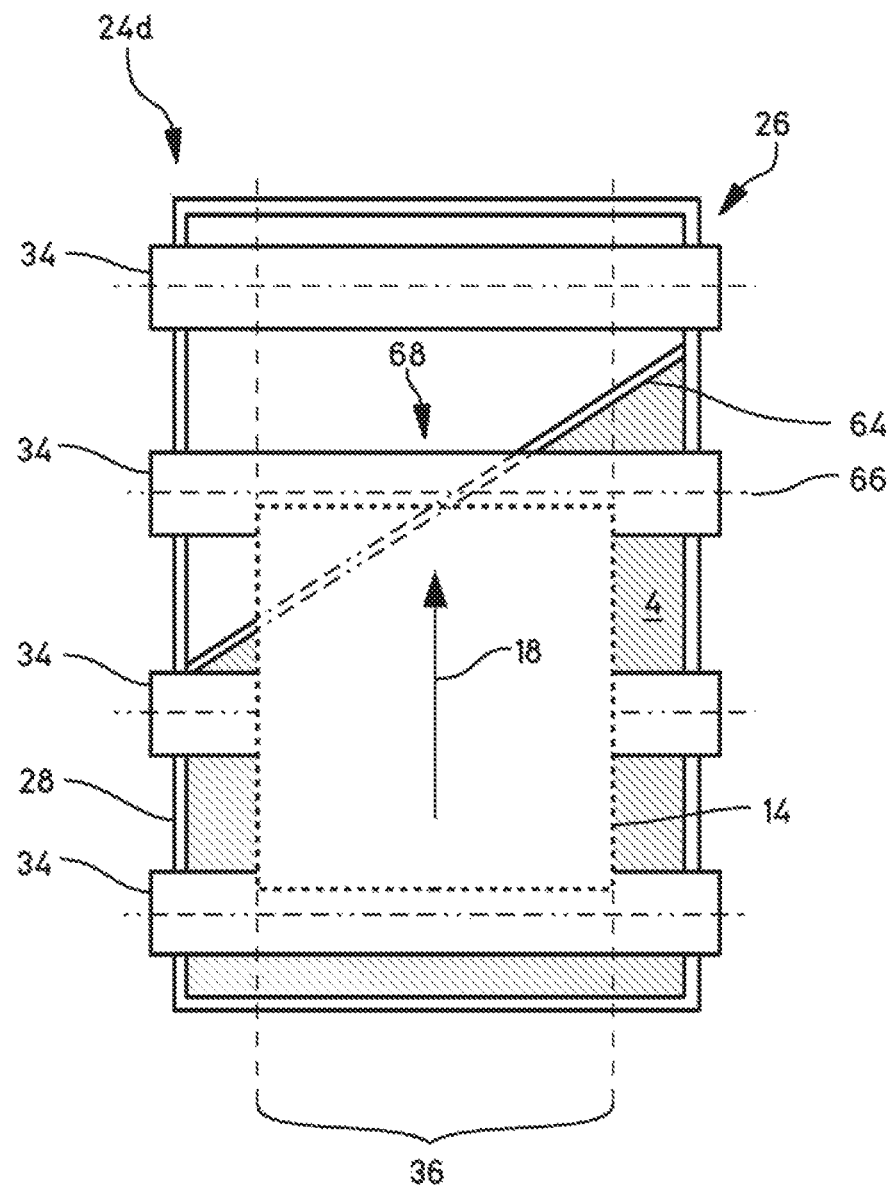
FIG. 8 shows a schematic illustration of a refinement of the device according to FIG. 3.
Figure 9:
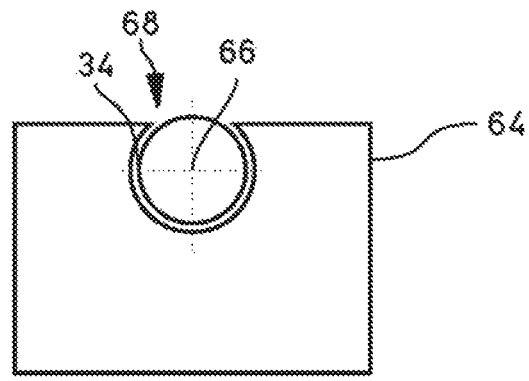
FIG. 9 shows a fragmented lateral view of the illustration according to FIG. 8.

FIG. 8 shows a schematic illustration of a further device 24d. The device 24d has a weir 64 which is penetrated by a rotation axle 66 of one of the transportation rollers 34. The weir 64 for this purpose has an opening 68 for receiving the axle 66. FIG. 9 shows a fragmented lateral view of the illustration of FIG. 8, and highlights the arrangement of the opening 68 for receiving the axle 66 of the transportation roller 34.

Figure 10:
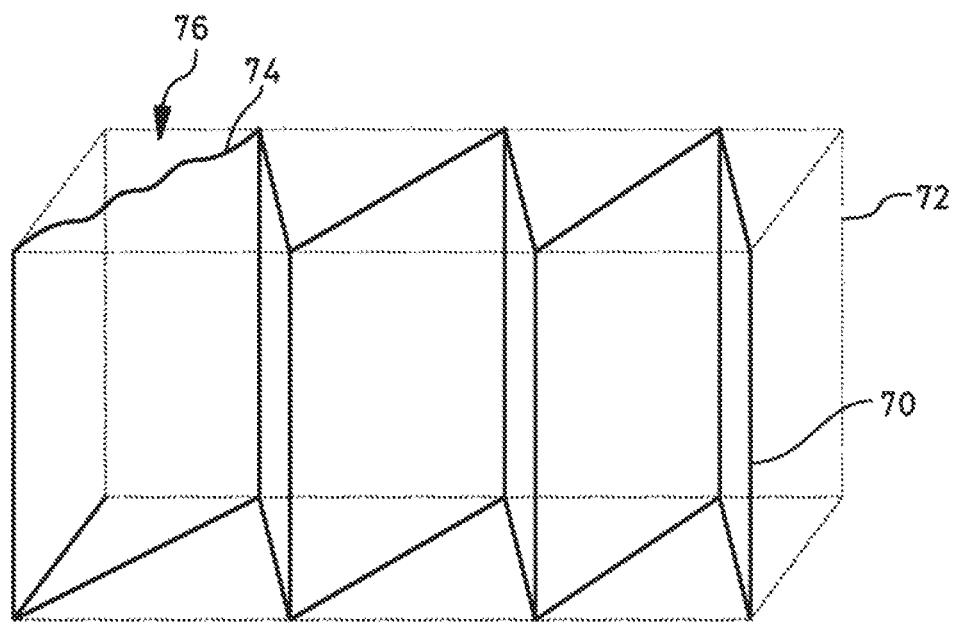
FIG. 10 shows a schematic illustration of a perspective view of a weir.

FIG. 10 shows a schematic illustration of a perspective view of a weir 70 for use in a device according to one of the preceding exemplary embodiments. The weir 70 is presently produced by means of subtraction of material, specifically by milling, from a primary body 72 which is illustrated with dashed lines. The weir 70 has an edge 74 which in portions has an undulated vertical profile 76. The vertical profile 76 can preferably be configured along the entire edge 74 of the weir 70, wherein for reasons of improved clarity of illustration only a profile of the vertical profile in portions is presently illustrated.

LIST OF REFERENCE SIGNS

2 Device according to the prior art
4 Liquid
6 Container
8 Weir
10 Straight edge
12 Transportation rollers
14 Substrate
16 Liquid film
18 Transportation direction
20 Liquid lamella
22 Substrate rear edge
23a, 23b Corner
24, 24a-d Device
26 Transportation device
28 Container
30 Weir 32 Oblique edge
34 Transportation rollers
36 Transportation track
38 Liquid lamella
39 Tear-off front
40 Weir
42 Inconsistent edge profile
44 Inconsistent edge
46 Protrusion
48 Main direction of extent
50 Sawtooth profile
52 Weir
54 Consistent edge
56 edge profile
58 Weir
60 Edge
62 Edge profile
64 Weir
66 Rotation axle
68 Opening
70 Weir
72 Primary body
74 Edge
76 Vertical profile
A Spacing
E Extent

The invention claimed is:

1. A substrate treatment device with a liquid, the device comprising:
   a container containing the liquid;
   a transportation device by which the substrates are transportable in a transportation direction through said container; and
   a weir having an edge, the said edge being navigable by the substrates and at least in portions running obliquely to the transportation direction of the substrates, and having at least one protrusion or at least one recess formed therein, said at least one protrusion or said at least one recess lying in a plane extending parallel to a surface of the liquid disposed in the substrate treatment device.

2. The substrate treatment device according claim 1, wherein said edge extends across at least two transportation tracks and there-between has an inconsistent edge profile.

3. The substrate treatment device according to claim 1, wherein said edge extends across at least two transportation tracks and there-between has a consistent edge profile.

4. The substrate treatment device according to claim 1, wherein said edge has points and an edge profile that is differentiable at each point.

5. The substrate treatment device according to claim 1, wherein said edge within at least one transportation track has an inconsistent edge profile.

6. The substrate treatment device according to claim 1, wherein said edge at least in portions has a rounded edge profile.

7. The substrate treatment device according to claim 1, wherein said edge extends across more than two transportation tracks.

8. The substrate treatment device according to claim 1, wherein said transportation device has transportation rollers that in the transportation direction are disposed ahead of and behind said weir and by means of said transportation rollers the substrates are transportable through said container that contains the liquid.

9. The substrate treatment device according to claim 8, wherein said edge extends across at least 50% of an available spacing of a first of said transportation rollers that when viewed in the transportation direction is disposed as a last one ahead of said weir from a second of said transportation rollers that when viewed in the transportation direction is disposed as a first one behind said weir.

10. The substrate treatment device according to claim 8, wherein said transportation rollers each have a rotation axle and said rotation axle of at least one of said transportation rollers penetrates said weir.

11. A weir for use in a device for treating substrates with a liquid, the weir comprising:
   a body having an edge running obliquely at least in portions, said edge having at least one protrusion or at least one recess formed therein, said at least one protrusion or said at least one recess lyinq in a plane extending parallel to a surface of the liquid disposed in the device.

12. The weir according to claim 11, wherein said at least one protrusion or said at least one recess extends in a direction that runs perpendicularly to a main direction of extent of the weir.

13. The weir according to claim 11, wherein said edge at least in portions has a sawtooth profile.

14. The weir according to claim 11, wherein said edge has a non-planar, undulated, vertical profile.

15. The weir according to claim 11, wherein the weir is produced by way of subtraction of material from a primary body.

16. The weir according to claim 11, wherein said body has at least one opening formed therein for receiving an axle.

* * * * *